United States Patent
Chan et al.

(10) Patent No.: US 9,929,250 B1
(45) Date of Patent: Mar. 27, 2018

(54) SEMICONDUCTOR DEVICE INCLUDING OPTIMIZED GATE STACK PROFILE

(71) Applicant: International Business Machines Corporation, Armonk, NY (US)

(72) Inventors: Victor Chan, Guilderland, NY (US); Jin Ping Han, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/277,722

(22) Filed: Sep. 27, 2016

(51) Int. Cl.
*H01L 29/66* (2006.01)
*H01L 29/49* (2006.01)

(52) U.S. Cl.
CPC .... *H01L 29/66545* (2013.01); *H01L 29/4966* (2013.01)

(58) Field of Classification Search
CPC ... H01L 29/49; H01L 29/496; H01L 29/4966; H01L 29/66; H01L 29/665; H01L 29/6654; H01L 29/66545
USPC .......................................................... 257/409
See application file for complete search history.

(56) References Cited

U.S. PATENT DOCUMENTS

| | | | |
|---|---|---|---|
| 6,475,841 B1 | 11/2002 | Taylor, Jr. et al. | |
| 7,208,361 B2 | 4/2007 | Shah et al. | |
| 7,365,015 B2 | 4/2008 | Lin et al. | |
| 8,329,546 B2 | 12/2012 | Lee et al. | |
| 8,466,503 B2 | 6/2013 | Anderson et al. | |
| 8,519,454 B2 | 8/2013 | Guo et al. | |
| 8,735,235 B2 | 5/2014 | Chuang et al. | |
| 9,087,886 B2 | 7/2015 | Kim | |
| 9,236,258 B2 * | 1/2016 | Xie | H01L 21/28008 |
| 2008/0265322 A1 | 10/2008 | Lin et al. | |
| 2009/0189201 A1 | 7/2009 | Chang et al. | |
| 2009/0206406 A1 | 8/2009 | Rachmady et al. | |
| 2011/0241118 A1 | 10/2011 | Ng et al. | |
| 2014/0203335 A1 * | 7/2014 | Song | H01L 29/78 257/288 |
| 2015/0084116 A1 | 3/2015 | Ring et al. | |
| 2015/0187939 A1 | 7/2015 | Wu et al. | |

* cited by examiner

*Primary Examiner* — Monica D Harrison
(74) *Attorney, Agent, or Firm* — Cantor Colburn LLP; Vazken Alexanian

(57) ABSTRACT

A semiconductor device is provided with an electrically conductive gate having an enhanced gate profile. The semiconductor device includes a semiconductor substrate that extends along a first axis to define a length and a second axis opposite the first axis to define a height. A channel region is interposed between opposing source/drain regions, and a gate stack is atop the semiconductor substrate. The gate stack includes an electrically conductive gate atop the channel region. The electrically conductive gate includes sidewalls extending between a base and an upper surface to define a gate height. A gate length of the electrically conductive gate continuously increases as the gate height increases from the base to the upper surface.

19 Claims, 7 Drawing Sheets

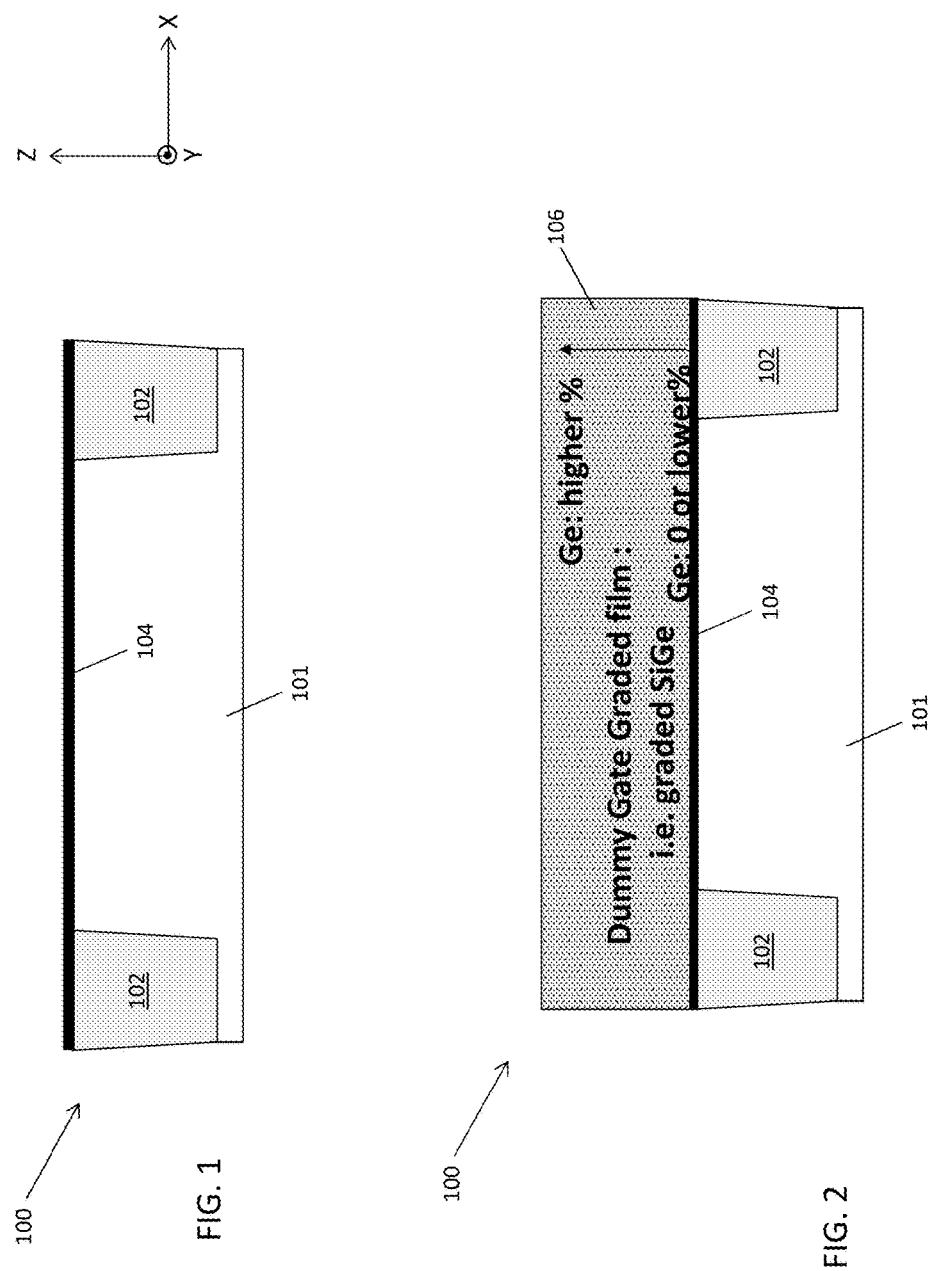

SEMICONDUCTOR DEVICE INCLUDING OPTIMIZED GATE STACK PROFILE

BACKGROUND

The present invention relates in general to semiconductor device fabrication methods and resulting structures. More specifically, the present invention relates to optimized gate stack fabrication methods and resulting structures for field effect transistors (FETs).

Semiconductor devices include a gate stack formed atop the channel region of the device. Either a gate-first or gate-last fabrication technique is performed to form the gate stack. A gate-last technique, also referred to as a replacement metal gate (RMG) process, includes first forming a sacrificial gate (i.e., dummy gate) atop the channel region, and then, as one of the final fabrication processes, replacing the dummy gate with a metal gate forming a pair of spacers on sidewalls of the sacrificial gate.

SUMMARY

According to a non-limiting embodiment, a method of fabricating a semiconductor device including an enhanced electrically conductive gate profile comprises forming a semiconductor substrate that extends along a first axis to define a length and a second axis opposite the first axis to define a height. The method further comprises forming a sacrificial gate atop the semiconductor substrate. The sacrificial gate includes a base portion formed on an upper surface of the semiconductor substrate and an upper surface portion located opposite the base portion. The method further includes expanding the upper surface portion of the sacrificial gate with respect to the base portion to form an expanded sacrificial gate. The method further includes removing the expanded sacrificial gate to form a gate trench including a base region having a first trench length and an upper surface region having a second trench length greater than the first trench length. The method further includes filling the gate trench with an electrically conductive material so as to form an electrically conductive gate having the enhanced electrically conductive gate profile.

According to another non-limiting embodiment, a method of enhancing a gate profile of an electrically conductive gate included in a field effect transistor (FET) comprises forming a semiconductor substrate that extends along a first axis to define a length and a second axis opposite the first axis to define a height. The method further includes forming a sacrificial gate atop the semiconductor substrate. The sacrificial gate has a thermal expansion coefficient that varies along the second axis between a base portion disposed on the semiconductor substrate and an upper surface portion of the sacrificial gate located opposite the base portion. The method further includes annealing the sacrificial gate such that the upper surface portion expands along the first axis further than the base portion. The method further includes replacing the sacrificial gate with an electrically conductive gate including a base that extends along the first axis to define a first gate length and an upper surface that extends along the first axis to define as second gate length that is greater than the first gate length.

According to another non-limiting embodiment, a semiconductor device is provided with an electrically conductive gate having an enhanced gate profile. The semiconductor device includes a semiconductor substrate that extends along a first axis to define a length and a second axis opposite the first axis to define a height. A channel region interposed between opposing source/drain regions, and a gate stack is atop the semiconductor substrate. The gate stack includes an electrically conductive gate atop the channel region. The electrically conductive gate includes sidewalls extending between a base and an upper surface to define a gate height. A gate length of the electrically conductive gate continuously increases as the gate height increases from the base to the upper surface.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 1-8 are a series of views illustrating a method of fabricating a semiconductor device including an optimized gate profile, in which:

FIG. 1 is a cross-sectional view of semiconductor substrate including a gate dielectric formed atop an active semiconductor layer;

FIG. 2 is a cross-sectional view of the semiconductor substrate illustrated in FIG. 1 following formation of a graded sacrificial layer atop the gate dielectric layer;

FIG. 3 is a cross-sectional view of the semiconductor substrate illustrated in FIG. 2 following formation of a hardmask layer atop the graded sacrificial layer;

FIG. 4 is a cross-sectional view of an intermediate semiconductor device after patterning the graded sacrificial layer and performing various gate structure and source/drain fabrication processes to form a gate stack including a multi-layer sacrificial gate;

FIG. 5 is a cross-sectional view of an intermediate semiconductor device shown in FIG. 4 undergoing an anneal process;

FIG. 6 is a cross-sectional view of an intermediate semiconductor device shown in FIG. 5 having an expanded sacrificial gate resulting from the anneal process;

FIG. 7 is cross-sectional view of an intermediate semiconductor device shown in FIG. 6 after removing the sacrificial gate to form a gate trench having an expanded upper surface region; and FIG. 8 cross-sectional view of an intermediate semiconductor device shown in FIG. 7 after filling the gate trench with a conductive gate structure having an optimized gate profile.

FIGS. 9-14 are a series of views illustrating a method of fabricating a semiconductor device including an optimized gate profile according to another embodiment, in which:

FIG. 9 is a cross-sectional view of semiconductor substrate including a multi-layer sacrificial stack formed atop an active semiconductor layer;

FIG. 10 is a cross-sectional view of an intermediate semiconductor device after performing various gate structure and source/drain fabrication processes to form a gate stack including a multi-layer sacrificial gate;

FIG. 11 is a cross-sectional view of the intermediate semiconductor device shown in FIG. 10 undergoing an anneal process;

FIG. 12 is a cross-sectional view of the intermediate semiconductor device shown in FIG. 11 having an expanded sacrificial gate resulting from the anneal process;

FIG. 13 is cross-sectional view of the intermediate semiconductor device shown in FIG. 12 after removing the sacrificial gate to form a gate trench having an expanded upper surface region; and FIG. 14 cross-sectional view of the intermediate semiconductor device shown in FIG. 13 after filling the gate trench with a conductive gate structure having an optimized gate profile.

DETAILED DESCRIPTION

Figures 3, 4:
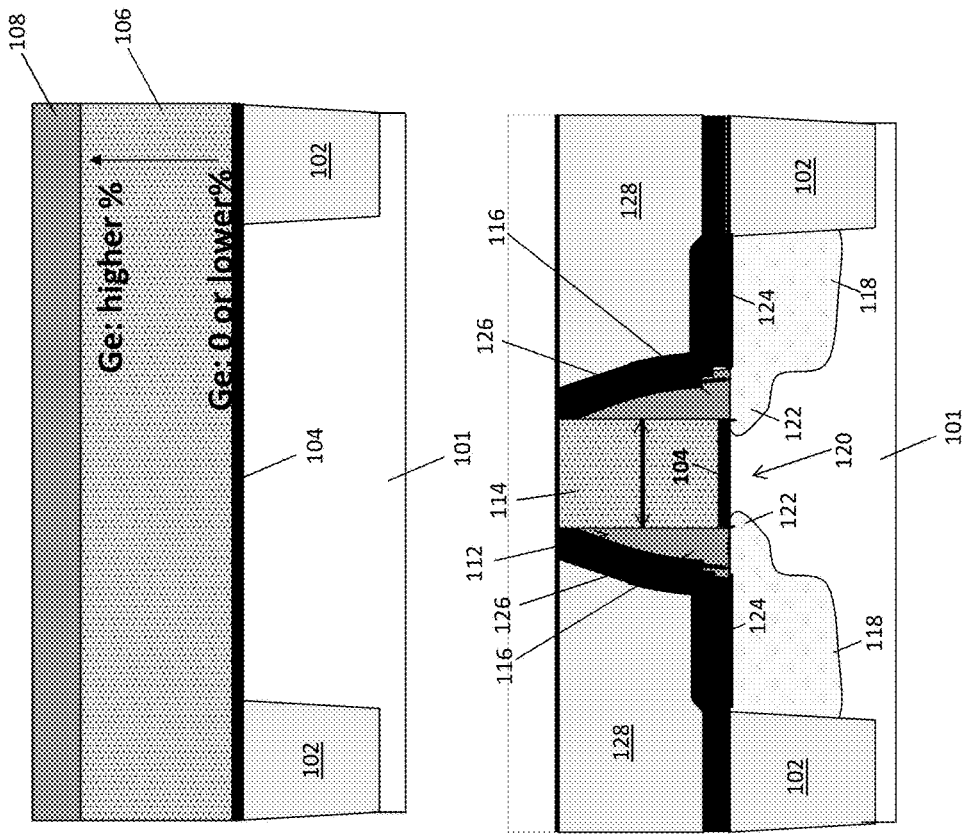

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present invention utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to embodiments of the present invention, as previously noted herein, semiconductor devices include a gate stack formed atop the channel region of the device. Either a gate-first or gate-last fabrication technique is performed to form the gate stack. A gate-last technique, also referred to as a replacement metal gate (RMG) process, includes first forming a sacrificial gate (i.e., dummy gate) atop the channel region, and then, as one of the final fabrication processes, replacing the dummy gate with a metal gate. In an exemplary RMG process, a pair of spacers is formed on sidewalls of the sacrificial gate. Source/drain regions are then formed before the sacrificial gate is removed (i.e., pulled) from between the pair of spacers using an anisotropic vertical etch process such as a reactive ion etch (RIE). Accordingly, a gap (i.e., gate trench) is formed between the spacers.

An electrically conductive material is subsequently deposited in the gate trench to form the gate. The gate is typically formed of a metal material such as, for example, tungsten. The RMG is beneficial in that the source/drain (S/D) regions and S/D contacts are self-aligned with respect to the subsequently formed metal gate. Accordingly, device variation is reduced. However, the continued reduction in semiconductor device footprints has made it more difficult to properly fill the gate trench with the electrically metal material (e.g., tungsten).

In one or more embodiments of the invention, a semiconductor device is provided that includes an optimized gate stack profile. Conventional gate stacks typically include sidewalls having a uniform shape, which when pulled according to a replacement metal gate process (RMG) process, forms a gate trench with a similar uniform profile. Accordingly, the subsequently deposited electrically conductive material takes on the shape of the gate trench to form an electrically conductive gate that also has sidewalls with a uniform shape which define a uniform profile.

The optimal profile of the electrically conductive gate provided by embodiments of the invention includes a base that extends between the gate spacers to define a first gate length, and an upper gate surface having a second gate length that is greater than the first gate length. In one example, a gate stack is provided which has a gate length that gradually increases from the base to the upper gate surface.

To achieve the optimized profile of the inventive gate stack, in one or more embodiments an RMG process is performed which employs a sacrificial gate (dummy gate) that is ultimately replaced with an electrically conductive gate. Unlike conventional RMG processes, however, a sacrificial gate is employed which is composed of a graded sacrificial material. That is, the composition of the sacrificial material varies from the base of sacrificial gate (i.e., closest to the channel region) to the opposing upper surface of the sacrificial gate. For instance, the sacrificial material can be formed of silicon germanium (SiGe), where the base of the sacrificial gate has a lower concentration of germanium (Ge) compared to the upper surface of the sacrificial gate. Exposing the graded sacrificial material to an annealing process causes a non-uniform expansion of the sacrificial gate thereby creating a sacrificial gate with non-uniform sidewalls, and thus a non-uniform profile. The non-uniform sacrificial gate prolife can be exploited because removing the sacrificial gate results in a gate trench also having a non-uniform profile. The increased gate length at the upper region of the gate trench allows for optimal filling compared to conventional RMG processes. In this manner, a semiconductor device having a reduced footprint is provided while improving gate trench filling capabilities.

With reference now to FIG. 1, a starting semiconductor substrate 100 is illustrated. The substrate 100 includes an active semiconductor layer 101 composed of a semiconductor material such as silicon (Si), for example, and extends along a first axis (e.g., X-axis) to define a length, a second axis (e.g., Y-axis) to define a width, and a third axis (e.g., Z-axis) to define a height. One or more shallow trench isolation (STI) regions 102 are formed in the semiconductor layer 101, and are configured to mitigate electrical current leakage between adjacent regions of the substrate 100. The STI regions 102 can be formed by etching a pattern of one or more trenches (not shown) in the substrate 100, depositing one or more dielectric materials (e.g., $SiO_2$) to fill the trenches, and removing excess any dielectric material using various suitable surface material removal techniques such as, for example, a chemical-mechanical planarization (CMP) process. Although a bulk semiconductor substrate is illustrated in FIG. 1, it should be appreciated that the semiconductor substrate can be formed as a semiconductor-on-insulator (SOI) substrate without departing from the scope of the invention.

Still referring to FIG. 1, a gate dielectric layer 104 is formed on an upper surface the substrate 100. The gate dielectric layer 104 can be formed from various high-dielectric (high-k) materials including, but not limited to, hafnium oxide ($HfO_2$), aluminum oxide ($Al_2O_3$), a hafnium silicate ($HfSiO_x$), zirconium dioxide ($ZrO_2$), or a hafnium zirconate ($HfZrO_x$). Various suitable techniques for depositing the gate dielectric layer 104 can be employed including, for example, an atomic layer deposition (ALD) process. The gate dielectric layer 104 has a thickness (e.g., extending along the Z-axis) ranging from about 1 nanometer (nm) to about 2 nm.

Turning to FIG. 2, the substrate 100 is illustrated following formation of a graded sacrificial layer 106 on an upper surface of the gate dielectric layer 104. The graded sacrificial layer 106 is formed by depositing a sacrificial material composed of a dominant thermal sensitive chemical element on the upper surface substrate 100. The dominant thermal sensitive chemical element can be determined as a chemical element having the highest thermal expansion coefficient (a) among the remaining elements of the sacrificial layer 106. The graded sacrificial material can be deposited using various suitable deposition techniques including, but not limited to, ALD, and chemical vapor deposition. The thickness (e.g., extending along the Z-axis) of the graded sacrificial layer 106 ranges, for example, from approximately 40 nm to approximately 100 nm.

To achieve the graded composition of the graded sacrificial layer 106, the sacrificial material can be deposited such that the concentration of the dominant thermal sensitive chemical element varies between the base of the graded sacrificial layer 106 (i.e., closest to the gate dielectric layer 104) and the opposing upper surface of the graded sacrificial layer 106. Various techniques can be used to achieve the graded sacrificial layer 106 including, but not limited to, electron beam deposition (EBD) with varying energy levels, to provide a dominant thermal sensitive chemical element into the sacrificial layer 106. Various methods exist to determine the gradient percentages of the graded sacrificial layer 106 including, but not limited to, energy dispersive X-ray spectroscopy (EDS) and electron energy loss spectroscopy (EELS).

For instance, a sacrificial material composed of silicon germanium (SiGe) can be deposited on the upper surface of the high-k layer. In this example, germanium (Ge) has a greater thermal sensitivity than the base chemical element (e.g., Si), and therefore acts as the dominant thermal sensitive chemical element of a graded sacrificial layer formed of SiGe. In a non-limiting embodiment, base of the graded sacrificial layer 106 contains about 10%-15% of Ge, and the amount of Ge gradually increases toward the upper surface of graded sacrificial layer 106 which contains about 40% to about 90% of GE, for example. The amount of Ge, however, is not limited thereto. Accordingly, the base of the graded sacrificial layer 106 has a lower concentration of germanium (Ge) (or even no Ge) compared to the upper surface of the graded sacrificial layer 106. The concentration of Ge can gradually increase from the base of the sacrificial layer 106 to the upper surface of the graded sacrificial layer 106, as indicated by the rising arrow shown in FIG. 2.

Although Ge is implemented as the dominant thermal sensitive chemical element, any combination of chemical elements can be used where a second chemical element has a greater thermal sensitive than the first chemical element(s). For example, the graded sacrificial material can be composed of silicon carbide (SiC). In this case, carbon (C) has a lower thermal sensitivity than silicon (Si). Accordingly, Si is the dominant thermal sensitive chemical element. Therefore, the upper region of the graded sacrificial layer 106 has a lower concentration of C compared to the base of the graded sacrificial layer 106. That is, a greater percentage of Si exists at the upper region of the graded sacrificial layer 106 compared to the percentage of Si that exists at the base of the graded sacrificial layer 106. The concentration of C can gradually increase from the upper surface of the graded sacrificial layer 106 to the base of the graded sacrificial layer 106.

Referring to FIG. 3, the substrate 100 is illustrated following deposition of a hardmask layer 108 on an upper surface of the graded sacrificial layer 106. The hardmask layer 108 can be composed of various nitride materials such as silicon nitride (SiN), for example, and can be deposited using various suitable deposition techniques including, but not limited to, ALD and CLD. The thickness (e.g., along the Z-axis) of the hardmask layer 108 can range from approximately 10 nm to approximately 50 nm. The hardmask layer 108 serves to protect a desired portion of the underlying graded sacrificial layer 106 that is intended to serve as the sacrificial gate (i.e., dummy gate) as described herein.

Turning now to FIG. 4, an intermediate semiconductor device 110 is illustrated following formation of a gate stack 112 including a graded sacrificial gate 114 (i.e., graded dummy gate 114) on the upper surface of the semiconductor substrate 100. Although the intermediate semiconductor device 110 is illustrated as a planar-type FET, it should be appreciated that the intermediate semiconductor device 110 can be formed as having other topologies such as a fin-type FET (i.e., finFET), for example, without departing from the scope of the invention. At this stage of the process flow, the profile of the graded sacrificial gate 114 is substantially uniform, and ranges from approximately 5 nm to approximately 32 nm. That is, the gate length (indicated by the single horizontal arrow) of the sacrificial gate 114 remains equal or substantially equal as the sacrificial gate 114 extends from its base to its upper surface.

The graded sacrificial layer 106 and the hardmask layer 108 are patterned using various photolithography and etching techniques to form the sacrificial gate 114. For example, a pattern is defined by applying a photoresist (not shown) to the upper surface of the hardmask layer 108. The photoresist is then exposed to a pattern of radiation; and to develop the pattern into the photoresist utilizing a resist developer. Once the patterning of the photoresist is completed, the sections covered by the photoresist are protected while the exposed regions are removed using a selective etching process that recess the unprotected regions. Accordingly, a portion of the upper surface of the substrate 100 is exposed. The term "selective" in reference to a material removal process denotes that the rate of material removal for a first material is greater than the rate of removal for at least another material of the structure to which the material removal process is being applied. The patterned resist can then be removed using an oxygen-based ($O_2$) ash process, or can be stripped using a wet chemical process.

Still referring to FIG. 4, opposing spacers 116 are formed on the sidewalls of the graded sacrificial gate 114. The spacers 116 can be formed by depositing a nitride layer (not shown) on the exterior surfaces of the graded sacrificial gate 114 and the upper surface of the substrate 100, and then etching nitride layer away from the upper surface of the substrate using a directional etching process that is selective to the nitride material. The spacers 116 can have a width (e.g., extending along the X-axis) that ranges from approximately 5 nm to approximately 20 nm.

Following the formation of the spacers 116, source/drain (S/D) regions 118 are formed in the active semiconductor layer 101. The S/D regions 118 define a channel region 120 therebetween which is also formed beneath the graded sacrificial gate 114. The S/D regions 118 can optionally include extension regions 122 that overlap the spacers 118 and partially extend beneath the sacrificial gate 114. The S/D regions 118 can be formed using, for example, an ion implantation process.

For instance, p-type S/D regions 118 for a p-type semiconductor device 110 are typically produced using group III-A elements and n-type source extension regions for an n-type semiconductor device are typically produced with group V elements. In the case of the p-type implants, a typical impurity species is boron or $BF_2$. Boron with an energy of 0.2 keV to 3.0 keV or $BF_2$ with an energy of 1.0 keV to 15.0 keV and a dose of $5\times10^{13}$ atoms/cm$^2$ to about $3\times10^{16}$ atoms/cm$^2$ can be used to implant the p-type region. A typical implant for the n-type regions is arsenic.

When forming an n-type semiconductor device 110, n-type regions 118 can be implanted with arsenic using energy of 0.5 keV to 5.0 keV with a dose of $3\times10^{13}$ atoms/cm$^2$ to $3\times10^{16}$ atoms/cm$^2$.

Optional deep S/D regions typically have same conductivity as their corresponding S/D regions 118, but have a greater dopant concentration and are implanted with a higher energy. Various strain-inducing techniques (e.g., compressive straining or tensile straining) can also be applied to the S/D regions 118 to enhance electron or hole mobility therethrough.

Silicide layers 124 can also formed atop the S/D regions 118. Silicide formation typically involves depositing a metal layer onto the surface of a Si-containing material or wafer. The metal layer can be deposited by any suitable deposition process including, but not limited to, chemical vapor deposition (CVD), plasma-assisted CVD, high-density chemical vapor deposition (HDCVD), plating, sputtering, evaporation and chemical solution deposition. Metals deposited for silicide formation include tantalum (Ta), titanium (Ti), tungsten (W,) platinum (Pt), cobalt (Co), nickel (Ni), and combinations thereof. Following deposition, the semiconductor device 110 can then be subjected to an annealing step. During annealing, the deposited metal reacts with Si to form the silicide layers 124.

As further illustrated in FIG. 4, a contact-etch stop layer (CESL) 126 is deposited over the silicide layers 124, the spacers 118, and the sacrificial gate 120. An interlevel dielectric (ILD) layer 128 is then deposited on an upper surface of the CESL 126, and is planarized until a portion of the CESL 126 is exposed.

The ILD layer 128 can be formed from a dielectric material including, but not limited to, $SiO_2$, $Si_3N_4$, $SiO_xN_y$, SiC, SiCO, SiCOH, and SiCH. The Si element of the above-mentioned silicon-containing materials can also replaced by Ge; carbon-doped oxides; inorganic oxides; inorganic polymers; hybrid polymers; organic polymer, other carbon-containing materials; organic-inorganic materials such as spin-on glasses and silsesquioxane-based materials; and diamond-like carbon or amorphous hydrogenated carbon. Additional choices for the ILD layer 128 include any of the aforementioned materials in porous form, or in a form that changes during processing to or from being porous and/or permeable to being non-porous and/or non-permeable. The ILD layer 125 can be formed by any suitable deposition process, including, but not limited to, spin-coating, spraying from solution, CVD, plasma enhanced CVD (PECVD), sputter deposition, reactive sputter deposition, ion-beam deposition, and evaporation. The blanket deposited ILD layer 128 is planarized until reaching the CESL 126. In this manner, the upper surface of the graded sacrificial gate 114 is flush (i.e., coplanar) with an upper surface of the ILD layer 128.

Figure 5:
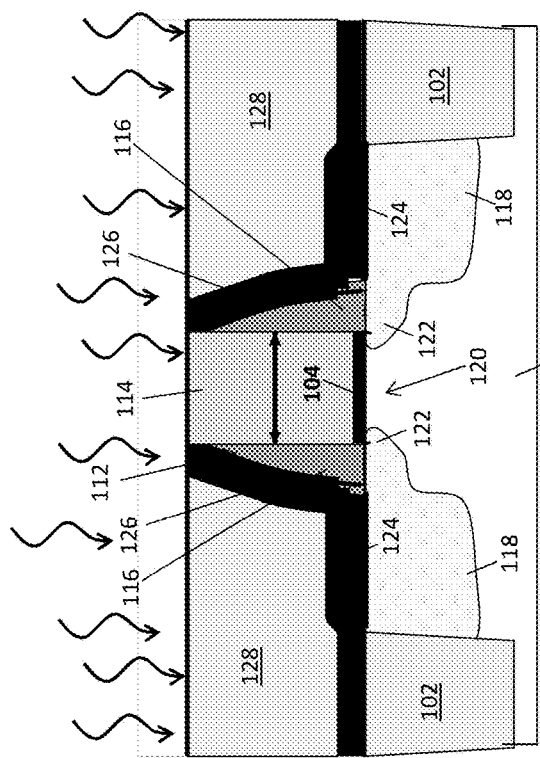

Turning now to FIG. 5, the semiconductor device 110 is illustrated while undergoing an anneal process such as, for example, a thermal anneal or a laser anneal. The anneal process exposes the device 110, and in particular, the graded sacrificial gate 114, to temperatures ranging from approximately 700 degrees Celsius (° C.) to approximately 1300° C. As described herein, the dominant thermal sensitive chemical element of the graded sacrificial gate 114 reacts more in response to the increased temperatures than the remaining chemical element(s) of the graded sacrificial gate 114. In terms of a SiGe graded sacrificial gate 114, for example, the Ge has greater thermal expansion coefficient ($\alpha_{Ge}$) when exposed to high temperatures compared to the thermal expansion coefficient ($\alpha_{Si}$) of the remaining Si. This thermal coefficient differential between the Si and the Ge is further exploited by gradually increasing the concentration of the dominant thermal sensitive material (e.g., Ge) from the base of the graded sacrificial gate 114 to the upper surface of the graded sacrificial gate 114. Accordingly, the graded sacrificial gate 114 will expand in a non-uniform manner in response to the anneal process.

Figure 6:
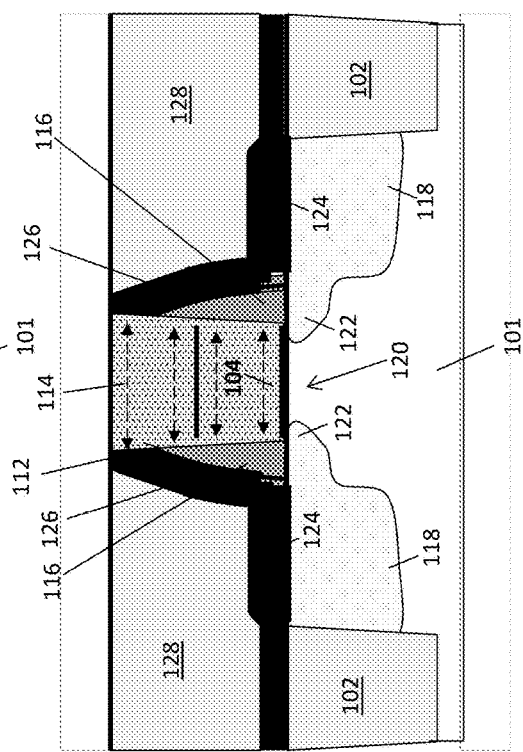

Referring to FIG. 6, the semiconductor device 110 is illustrated following the anneal process. The upper surface of the graded sacrificial gate 114 is shown as having a greater gate length compared to the base because the highest concentration of the dominant thermal sensitive chemical element (e.g., Ge) was initially deposited at the upper surface. As shown by the horizontal arrows, the gate length of the graded sacrificial gate 114 continuously increases as the height (e.g., distance along the Z-axis) of the sacrificial gate 114 increases from its base to its upper surface. An embodiment of the invention provides a feature where the top gate length (the gate length at the upper surface of the graded sacrificial gate 114) is about 1 nm to about 10 nm larger than the base of the graded sacrificial gate 114, dependent on the Ge dose, the anneal temperature and the anneal rate.

Figure 7:
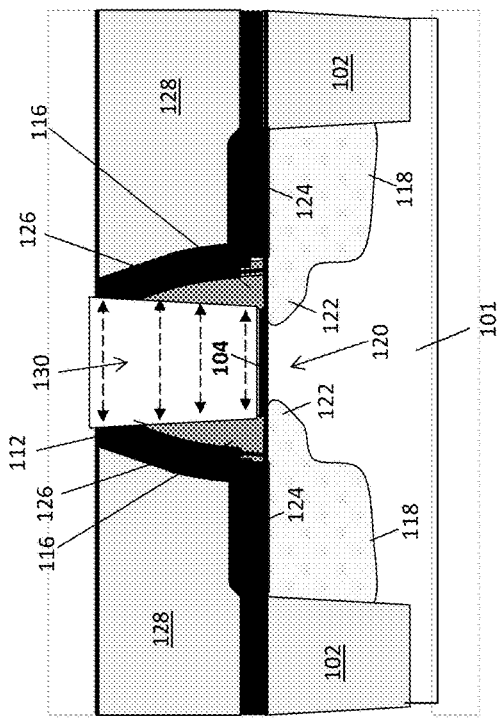

Turning now to FIG. 7, the intermediate device 110 is illustrated following removal of the graded sacrificial gate 114 to form a gate trench 130. The gate trench 130 has substantially the same profile of the annealed sacrificial gate 114. Accordingly, the gate trench 130 has a variety of lengths (indicated by the horizontal arrows) which gradually increase as the height (e.g., distance along the Z-axis) of the trench 130 increases from the gate dielectric layer 104 to the upper surface of the device 110. For instance, a base region of the gate trench 130 located at that gate dielectric layer 104 has a first trench length, and the upper surface region of the gate trench 130 has as second trench length greater than the first trench length. The increased trench length of the upper surface region (i.e., at the upper surface of the device 110) allows for improved access to the gate trench 130 when forming the final conductive gate structure (not shown in FIG. 7), thereby allowing improved control of the replacement gate profile and process window.

Figure 8:
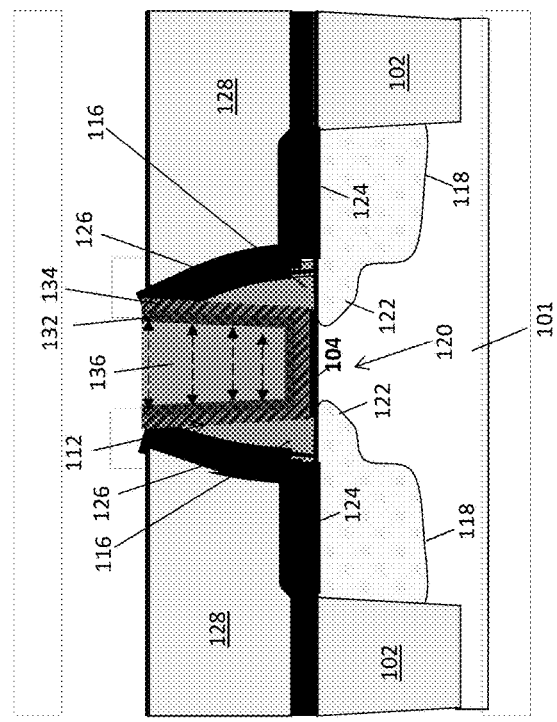

Turning to FIG. 8, a semiconductor device 110 including an optimized gate stack profile is shown after forming a conductive gate structure in the previously formed gate trench 130. The conductive gate structure includes one or more work function metal layers 132-134 and an electrically conductive gate 136. The work function metal layers 132-134 line the inner sidewalls of the previously formed trench 130 along with the upper surface of the gate dielectric layer 104. One or more of the work function metals 132-136 are configured to reduce gate leakage and tune the work function value of the device 110.

The first work function metal layer 132 is composed of tantalum nitride (TaN), for example, and is formed against the sidewalls of the trench 130 and the upper surface of the gate dielectric 104. The second work function metal layer 134 is composed of titanium nitride (TiN), titanium aluminum (TiAl), a combination of titanium aluminum and nitrogen (TiAlN), etc., for example, and lines the outer surface of the first work function metal layer 132. Various deposition processes can be used to deposit the first and second work function metal layers 132-134 including, but not limited to, an ALD process and a sputter deposition process. The thickness of the first work function metal layer 132 ranges from approximately 1 nm to approximately 10 nm. Similarly, the thickness of the second work function metal layer 134 ranges from approximately 1 nm to approximately 10 nm.

The conductive gate 136 is formed by depositing a conductive material atop the second work function metal layer 134 to fill the trench 130. The conductive material includes, but is not limited to, tungsten (W), polycrystalline or amorphous silicon, germanium, silicon germanium, a metal (e.g., titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The gate conductor can further include a workfunction setting layer. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC), and combinations thereof.

A chemical-mechanical planarization (CMP) process can be performed which stops on the CESL 126 to remove excess conductive material from the upper surface of the device 110. In this manner, the upper surface of the conductive gate 136 is formed flush with the upper surface of the device 110, along with the work function metal layers 132-134. It should be appreciated that at this stage of the process flow, the gate stack 112 includes the gate dielectric layer 104, the work function metals 132-134, and the conductive gate 136.

The device fabrication process flow described herein results in a conductive gate 136 having a non-uniform profile. In particular, the gate length (indicated by varying horizontal arrows) of the conductive gate 136 continuously increases as the height (e.g., distance along the Z-axis) of the conductive gate 136 increases from its base to its upper gate surface. Accordingly, the conductive gate 136 has several different gate lengths as it extends from its base to its upper gate surface as further illustrated in FIG. 8.

Figures 9, 10:
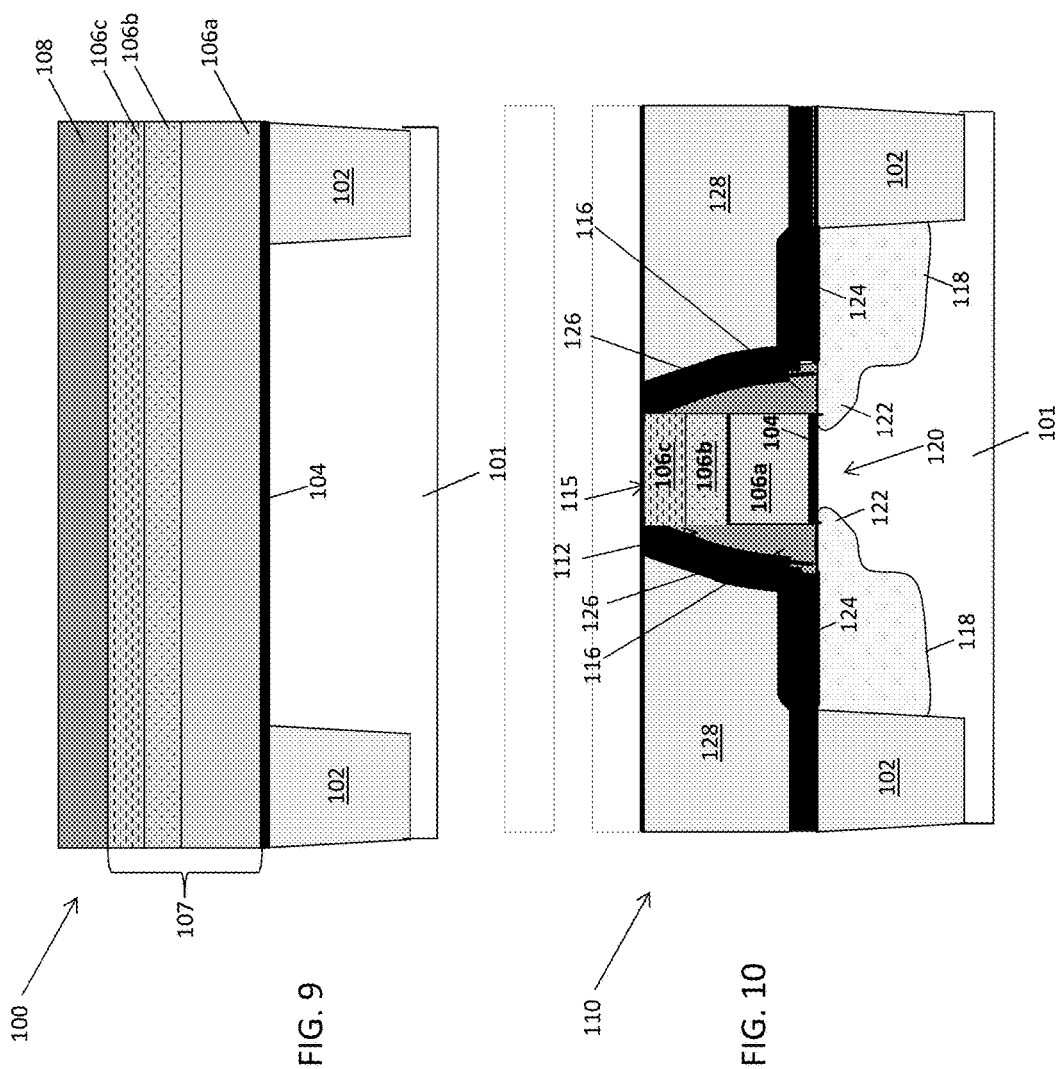

With reference now to FIGS. 9-14, a series of diagrams illustrates a method of fabricating a semiconductor device 110 including an optimized gate stack profile according to another embodiment. Turning to FIG. 9, a starting semiconductor substrate 100 is illustrated. The substrate 100 includes a semiconductor layer 101 composed of a semiconductor material such as silicon (Si), for example, and extends along a first axis (e.g., X-axis) to define a length, a second axis (e.g., Y-axis) to define a width, and a third axis (e.g., Z-axis) to define a height. One or more STI regions 102 are formed in the active semiconductor layer 101 and are configured to mitigate electrical current leakage between adjacent regions of the substrate 100. The STI regions 102 can be formed by etching a pattern of one or more trenches (not shown) in the substrate 100, depositing one or more dielectric materials (e.g., $SiO_2$) to fill the trenches, and removing excess any dielectric material using various suitable surface material removal techniques such as, for example, a chemical-mechanical planarization (CMP) process.

A gate dielectric layer 104 is formed on an upper surface the substrate 100. The gate dielectric layer 104 can be formed from various high-k materials including, but not limited to, hafnium oxide ($HfO_2$), aluminum oxide ($Al_2O_3$), a hafnium silicate ($HfSiO_x$), zirconium dioxide ($ZrO_2$), or a hafnium zirconate ($HfZrO_x$). Various suitable techniques for depositing the gate dielectric layer 104 atop the substrate 100 can be used including, for example, an ALD process. The gate dielectric layer 104 has a thickness (e.g., extending along the Z-axis) ranging from about 1 nanometer (nm) to about 2 nm.

Still referring to FIG. 9, a sacrificial stack 107 is formed on an upper surface of the gate dielectric layer 104. The sacrificial stack 107 includes a stacked arrangement of two or more sacrificial layers. The sacrificial layers can include different materials with respect to one another, or can include layers of the same material but with different concentrations of a thermal sensitive chemical element. The embodiment illustrated in FIG. 9, for example, illustrates a sacrificial stack 107 including a first sacrificial layer 106a formed on an upper surface of the gate dielectric layer 104, a second sacrificial layer 106b formed on an upper surface of the first sacrificial layer 106a, and a third sacrificial layer 106c formed on an upper surface of the second sacrificial layer 106b. A hardmask layer 108 is formed on an upper surface of the third sacrificial layer 106c serves to protect a desired portion of the underlying sacrificial stack 107 when forming the sacrificial gate (i.e., dummy gate) as described above.

The first sacrificial layer 106a is composed of poly-silicon (poly-si), for example, and has a thickness (e.g., the distance extending along the Z-axis) ranging from about 1 nm to about 50 nm. The second sacrificial layer 106b is composed of SiGe, for example, and has a thickness (e.g., the distance extending along the Z-axis) ranging from about 1 nm to about 50 nm. The third sacrificial layer 106c is composed of Ge, for example, and has a thickness (e.g., the distance extending along the Z-axis) ranging from about 1 nm to about 50 nm. In this example, the third sacrificial layer 106c composed of only Ge has the highest thermal expansion coefficient ($\alpha_C$) among the remaining sacrificial layers 106a-106b. The second sacrificial layer 106b composed of SiGe provides the second highest thermal expansion coefficient ($\alpha_B$), while the third sacrificial layer 106a composed of poly-Si has the lowest thermal expansion coefficient ($\alpha_A$). In this manner, a graded sacrificial stack 107 is formed which has a varied or heterogeneous thermal expansion coefficient. Although SiGe and Ge are utilized in this example, it should be appreciated that the second and third sacrificial layers 106b-106c can include different materials. For example, the second sacrificial layer 106b can include only carbon (C) while the third sacrificial layer 106c is composed of SiC.

Referring now to FIG. 10, an intermediate semiconductor device 110 is illustrated following formation of a gate stack 112 including a graded multi-layer sacrificial gate 115 (i.e., graded multi-layer dummy gate 115) on the upper surface of the semiconductor substrate 100. Although the intermediate semiconductor device 110 is illustrated as a planar-type FET, it should be appreciated that the intermediate semiconductor device 110 can be formed as a fin-type FET (i.e., finFET) without departing from the scope of the invention. At this stage of the process flow, the profile of the graded multi-layer sacrificial gate 115 is substantially uniform. That is, the gate length (indicated by the single horizontal arrow) of the multi-layer sacrificial gate 115 remains equal or substantially equal as the multi-layer sacrificial gate 115 extends from its base to its upper surface.

The graded multi-layer sacrificial gate 115 is formed by patterning the hardmask layer 108 and the multi-layer sacrificial stack 107 using the various photolithography and etching techniques described herein. Following formation of the multi-layer sacrificial gate 115, the gate stack 112 and remaining features of the intermediate semiconductor device 110 are formed as described above.

Figure 11:
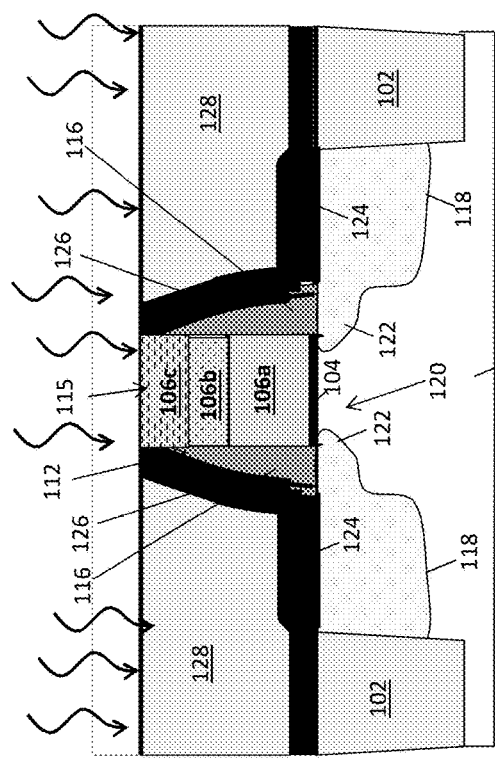

Turning to FIG. 11, the semiconductor device 110 is shown undergoing an anneal process. The anneal process exposes the device 110, and in particular, the graded multi-layer sacrificial gate 115, to temperatures ranging from approximately 700 degrees Celsius (° C.) to approximately 1300° C. The upper-most sacrificial layer (e.g., 106c) reacts more to the increased thermal temperatures compared to the remaining sacrificial layers (e.g., 106a-106b). In terms of the third sacrificial layer 106c (i.e., the upper-most layer) composed of Ge and the underlying second sacrificial layer 106b composed of SiGe, the Ge has greater thermal expansion coefficient ($\alpha_A$) when exposed to high temperatures compared to the thermal expansion coefficient ($\alpha_B$) of the second sacrificial layer 106b. This thermal coefficient differential between the third sacrificial layer 106c and the second sacrificial layer 106b causes the multi-layer sacrificial gate 115 to expand in a non-uniform manner in response to the anneal process.

Figure 12:
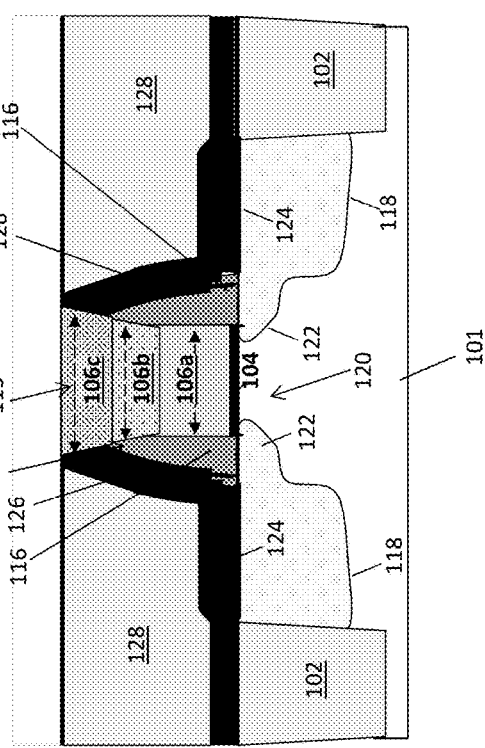

Referring to FIG. 12, the semiconductor device 110 is illustrated following the anneal process described above. The upper surface of the multi-layer sacrificial gate 115 including the third sacrificial layer 106c is shown as having a greater gate length compared to both a middle portion of the multi-layer sacrificial gate 115 including the second sacrificial layer 106b, and a base portion of the multi-layer sacrificial gate 115 including the first sacrificial layer 106a because the highest concentration of the dominant thermal sensitive chemical element (e.g., Ge) existed in the upper-most layer (e.g., the third sacrificial layer 106c). As shown by the horizontal arrows, the gate length of the multi-layer sacrificial gate 115 gradually increases as the height (e.g., distance along the Z-axis) of the multi-layer sacrificial gate 115 increases from first sacrificial layer 106a to the third sacrificial layer 106c.

Figure 13:
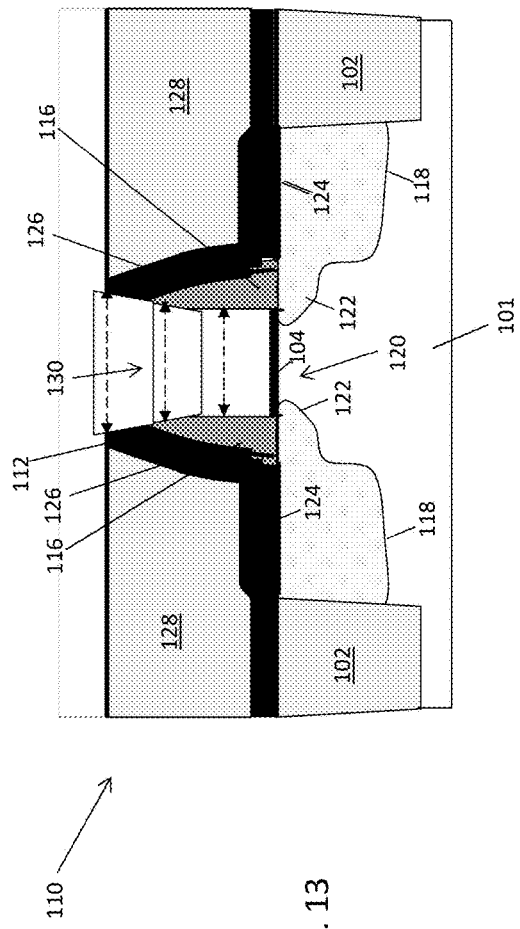

Turning now to FIG. 13, the intermediate device 110 is illustrated following removal of the multi-layer sacrificial gate 115 to form a gate trench 130. The gate trench 130 has substantially the same profile of the annealed multi-layer sacrificial gate 115. Accordingly, the gate trench 130 has several lengths (indicated by the horizontal arrows) which gradually increase as the height (e.g., distance along the Z-axis) of the trench 130 increases from the gate dielectric layer 104 to the upper surface of the device 110. The increased trench length at the upper surface of the device 110 allows for improved access to the gate trench 130 when forming the final conductive gate structure, thereby allowing improved control of the replacement gate profile and process window.

Figure 14:
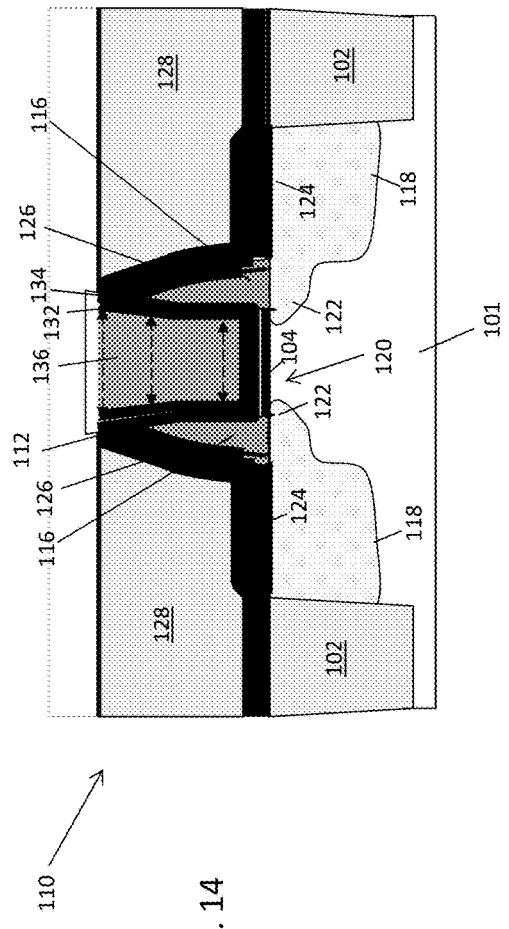

With reference to FIG. 14, a semiconductor device 110 including an optimized gate stack profile is shown after forming a conductive gate structure in the previously formed non-uniform gate trench 130. The conductive gate structure includes one or more work function metal layers 132-134 and an electrically conductive gate 136. The work function metal layers 132-134 line the inner sidewalls of the previously formed trench 130 along with the upper surface of the gate dielectric layer 104. Accordingly, the opening defined by the trench 130 is reduced based on the number of work function metal layers employed and/or the thickness of the work function metal layers. One or more of the work function metals 132-136 are configured to reduce gate leakage and tune the work function value of the device 110.

The first work function metal layer 132 is composed of TaN, for example, and is formed against the sidewalls of the trench 130 and the upper surface of the gate dielectric 104. The second work function metal layer 134 is composed of TiN, titanium TiAl, a combination of titanium aluminum and nitrogen (TiAlN), etc., for example, and lines the outer surface of the first work function metal layer 132. Various deposition processes can be used to deposit the first and second work function metal layers 132-134 including, but not limited to, an ALD process and a sputter deposition process. The thickness of the first work function metal layer 132 ranges from approximately 1 nm to approximately 10 nm. Similarly, the thickness of the second work function metal layer 134 ranges from approximately 1 nm to approximately 10 nm.

The conductive gate 136 is formed by depositing a conductive material atop the second work function metal layer 134 to fill the trench 130. The conductive material includes, but is not limited to, tungsten (W), polycrystalline or amorphous silicon, germanium, silicon germanium, a metal (e.g., titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The gate conductor can further include a workfunction setting layer. The work function layer can be a nitride, including but not limited to TiN, HfN, HfSiN, TaN, TaSiN, WN, MoN, NbN; a carbide, including but not limited to TiC, TiAlC, TaC, HfC, and combinations thereof.

A CMP process can be performed which stops on the CESL 126 to remove excess conductive material from the upper surface of the device 110. In this manner, the upper surface of the conductive gate 136 is formed flush with the upper surface of the device 110, along with the work function metal layers 132-134. It should be appreciated that at this stage of the process flow, the gate stack 112 includes the gate dielectric layer 104, the work function metals 132-134, and the conductive gate 136.

As illustrated in the FIG. 14, the device fabrication process flow described herein results in a conductive gate 136 having a non-uniform profile. In particular, the gate length (indicated by varying horizontal arrows) of the conductive gate 136 gradually increases as the height (e.g., distance along the Z-axis) of the conductive gate 136 increases from its base to its upper gate surface. Accordingly, the conductive gate 136 has several different gate lengths as it extends from its base to its upper gate surface.

As can be appreciated in view of the descriptions presented herein, a semiconductor device is provided that includes an optimized gate stack profile. Unlike conventional gate stacks that have a uniform shape, the gate stacks provided by one or more embodiments of the invention include a conductive gate having non-uniform profile. One or more fabrication process flows described herein achieves the non-uniform profile by forming a graded sacrificial gate composed of a sacrificial material having a varied concentration of a thermal sensitive chemical element. In response to annealing the graded sacrificial gate, the sacrificial material expands in a non-uniform manner to form a uniform gate trench. The upper area of the gate trench has an increased length allowing improved control of the replacement gate profile and process window.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device including an enhanced electrically conductive gate profile, the method comprising:
    forming a semiconductor substrate that extends along a first axis to define a length and a second axis opposite the first axis to define a height;
    forming a sacrificial gate atop the semiconductor substrate, the sacrificial gate including a base portion formed on an upper surface of the semiconductor substrate and an upper surface portion located opposite the base portion;
    expanding the upper surface portion of the sacrificial gate with respect to the base portion to form an expanded sacrificial gate;
    removing the expanded sacrificial gate to form a gate trench including a base region having a first trench length and an upper surface region having a second trench length greater than the first trench length; and
    filling the gate trench with an electrically conductive material so as to form an electrically conductive gate having the enhanced electrically conductive gate profile,
    wherein the electrically conductive gate extends along the second axis between a base and an upper portion to define a gate height, and wherein the enhanced electrically conductive gate profile includes the upper portion extending further along the first axis than the base to define a non-uniform shape of the electrically conductive gate.

2. The method of claim 1, wherein forming the sacrificial gate comprises:
    forming a graded sacrificial layer including a dominant thermal sensitive material atop the semiconductor substrate, a concentration of the dominant thermal sensitive material being greater at an upper surface portion of the graded sacrificial layer than at the base portion of the graded sacrificial layer; and
    patterning the graded sacrificial material to form the sacrificial gate, wherein the concentration of the dominant thermal sensitive material is greater at the upper surface portion of the sacrificial gate than at the base portion of the sacrificial gate.

3. The method of claim 2, wherein the sacrificial layer comprises silicon germanium (SiGe), and wherein the dominant thermal sensitive material is Ge.

4. The method of claim 2, wherein the sacrificial layer comprises silicon carbide (SiC), and wherein the dominant thermal sensitive material is Si.

5. The method of claim 1, wherein forming the sacrificial gate comprises:
    forming, atop the semiconductor substrate, a sacrificial stack including a plurality of individual sacrificial layers stacked along the second axis, the plurality of individual sacrificial layers including a first sacrificial layer having a first concentration of a first thermal sensitive material and a second sacrificial layer formed atop the first sacrificial layer and having a second concentration of a second thermal sensitive semiconductor substrate that is greater than the first concentration;

patterning the graded sacrificial material to form a multi-layer sacrificial gate such that the first thermal sensitive material is located at the upper surface portion of the multi-layer sacrificial gate, and the second thermal sensitive material is interposed between the first thermal sensitive material and the upper surface of the semiconductor substrate.

6. The method of claim 5, wherein forming the sacrificial stack comprises:

forming a base sacrificial layer on an upper surface of the semiconductor substrate;

forming the second thermal sensitive material on an upper surface of the base sacrificial layer; and forming the first thermal sensitive material on an upper surface of the second sacrificial layer.

7. The method of claim 6, wherein the base sacrificial layer comprises poly-silicon.

8. A method of enhancing a gate profile of an electrically conductive gate included in a field effect transistor (FET), the method comprising:

forming a semiconductor substrate that extends along a first axis to define a length and a second axis opposite the first axis to define a height;

forming a sacrificial gate atop the semiconductor substrate, the sacrificial gate having a thermal expansion coefficient that varies along the second axis between a base portion disposed on the semiconductor substrate and an upper surface portion of the sacrificial gate located opposite the base portion;

annealing the sacrificial gate such that the upper surface portion expands along the first axis further than the base portion; and replacing the sacrificial gate with an electrically conductive gate including a base that extends along the first axis to define a first gate length and an upper surface that extends along the first axis to define as second gate length that is greater than the first gate length.

9. The method of claim 8, wherein replacing the sacrificial gate includes:

removing the sacrificial gate after performing the annealing to form a gate trench including a base region having a first trench length and an upper surface region having a second trench length greater than the first trench length; and filling the gate trench with an electrically conductive material so as to form the electrically conductive gate.

10. The method of claim 9, wherein sidewalls of the electrically conductive gate extend along the second axis between a base and an upper gate surface to define a gate height, and wherein the enhanced electrically conductive gate profile includes the upper portion extending further along the first axis than the base.

11. The method of claim 10, wherein forming the sacrificial gate comprises:

forming a graded sacrificial layer including a dominant thermal sensitive material atop the semiconductor substrate, a concentration of the dominant thermal sensitive material being greater at an upper surface portion of the graded sacrificial layer than at the base portion of the graded sacrificial layer; and patterning the graded sacrificial material to form the sacrificial gate, wherein the concentration of the dominant thermal sensitive material is greater at the upper surface portion of the sacrificial gate than at the base portion of the sacrificial gate.

12. The method of claim 11, wherein the sacrificial layer comprises silicon germanium (SiGe), and wherein the dominant thermal sensitive material is Ge.

13. The method of claim 11, wherein the sacrificial layer comprises silicon carbide (SiC), and wherein the dominant thermal sensitive material is Si.

14. The method of claim 10, wherein forming the sacrificial gate comprises:

forming, atop the semiconductor substrate, a sacrificial stack including a plurality of individual sacrificial layers stacked along the second axis, the plurality of individual sacrificial layers including a first sacrificial layer having a first concentration of a first thermal sensitive material and a second sacrificial layer formed atop the first sacrificial layer and having a second concentration of a second thermal sensitive semiconductor substrate that is greater than the first concentration;

patterning the graded sacrificial material to form a multi-layer sacrificial gate such that the first thermal sensitive material is located at the upper surface portion of the multi-layer sacrificial gate, and the second thermal sensitive material is interposed between the first thermal sensitive material and the upper surface of the semiconductor substrate.

15. The method of claim 14, wherein forming the sacrificial stack comprises:

forming a base sacrificial layer on an upper surface of the semiconductor substrate;

forming the second thermal sensitive material on an upper surface of the base sacrificial layer; and forming the first thermal sensitive material on an upper surface of the second sacrificial layer.

16. The method of claim 15, wherein the base sacrificial layer comprises poly-silicon.

17. A semiconductor device including an electrically conductive gate having an enhanced gate profile, the semiconductor device comprising:

a semiconductor substrate that extends along a first axis to define a length and a second axis opposite the first axis to define a height, the semiconductor substrate including a channel region interposed between opposing source/drain regions;

a gate stack atop the semiconductor substrate, the gate stack including an electrically conductive gate atop the channel region, the electrically conductive gate including sidewalls extending between a base and an upper surface to define a gate height, wherein a gate length of the electrically conductive gate continuously increases non-uniformly as the gate height increases from the base to the upper surface.

18. The semiconductor device of claim 17, wherein the gate stack comprises:

a gate dielectric layer on an upper surface of the semiconductor substrate; and a work function metal layer on an upper surface of the gate dielectric layer and the sidewalls of the electrically conductive gate, wherein the base of the electrically conductive gate is directly on the work function metal layer.

19. The semiconductor device of claim 18, wherein the electrically conductive gate completely comprises a metal material.

* * * * *